US008086009B2

(12) United States Patent
Hirano et al.

(10) Patent No.: US 8,086,009 B2
(45) Date of Patent: Dec. 27, 2011

(54) METHOD AND APPARATUS FOR DISPLAYING PHASE CHANGE FUSED IMAGE

(75) Inventors: Masaya Hirano, Tokyo (JP); Tsuyoshi Matsuda, Tokyo (JP); Hasnine Akter Haque, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 1050 days.

(21) Appl. No.: 11/953,661

(22) Filed: Dec. 10, 2007

(65) Prior Publication Data

US 2008/0292166 A1 Nov. 27, 2008

(30) Foreign Application Priority Data

Dec. 12, 2006 (JP) ................. 2006-334078

(51) Int. Cl.
*G06K 9/00* (2006.01)
(52) U.S. Cl. ........ 382/130; 382/128; 382/131; 382/132; 382/284; 358/450
(58) Field of Classification Search .................. None
See application file for complete search history.

(56) References Cited

U.S. PATENT DOCUMENTS

| 3,831,082 | A |  | 8/1974 | Mazzagatti |  |
|---|---|---|---|---|---|
| 5,073,858 | A |  | 12/1991 | Mills |  |
| 5,332,968 | A | * | 7/1994 | Brown | 324/309 |
| 5,684,401 | A |  | 11/1997 | Peck et al. |  |
| 2003/0107375 | A1 | * | 6/2003 | McGee et al. | 324/307 |
| 2005/0017972 | A1 | * | 1/2005 | Poole et al. | 345/424 |
| 2005/0215897 | A1 | * | 9/2005 | Sakaguchi et al. | 600/437 |
| 2007/0055136 | A1 | * | 3/2007 | Yamamoto et al. | 600/410 |
| 2007/0230761 | A1 | * | 10/2007 | Gundel et al. | 382/131 |

FOREIGN PATENT DOCUMENTS

JP 2006-255046 9/2006

OTHER PUBLICATIONS

Haacke, et al., "Susceptibility Weighted Imaging (SWI)," Magentic Resonance in Medicine 52:612-618 (2004).
Reichenbach, et al., "High-Resolution MR Venography at 3.0 Telsa," J. of Computer Assisted Tomography 24 (6):949-957 (2000).

* cited by examiner

*Primary Examiner* — Phillip A Johnston
*Assistant Examiner* — Michael Logie
(74) *Attorney, Agent, or Firm* — Armstrong Teasdale LLP

(57) ABSTRACT

To allow the correspondence between a region having different susceptibility and a tissue structure to be easily visible, a phase change weighted image is produced by use of a phase of each pixel of phase change image data and a color bar, and an absolute value image is produced by use of an absolute value of each pixel of absolute value image data and a grayscale. Then, a phase change fused image in which the phase change weighted image and absolute value image are overlaid on each other is displayed.

16 Claims, 5 Drawing Sheets

METHOD AND APPARATUS FOR DISPLAYING PHASE CHANGE FUSED IMAGE

CROSS REFERENCE TO RELATED APPLICATIONS

This application claims the benefit of Japanese Patent Application No. 2006-334078 filed Dec. 12, 2006.

BACKGROUND OF THE INVENTION

The present invention relates to a method and apparatus for displaying a phase change fused image. More particularly, the present invention relates to a method and apparatus for displaying a phase change fused image to allow the correspondence between a region having different susceptibility and a tissue structure to be easily visible.

The technique of SWI (Susceptibility Weighted Imaging) has been proposed (see Non-patent documents 1, 2, and Patent document 1). In this technique, by use of phase information about MR (Magnetic Resonance) data, an image in which a contrast of the tissue having different susceptibility is weighted is produced.

Non-patent documents 1. E. Mark Haacke, and three others, "Susceptibility Weighted Imaging (SWI)," Magnetic Resonance in Medicine 52, pp. 612-618 (2004).

Non-patent documents 2. Jurgen R. Reichenbach, and five others, "High-Resonance MR Venography at 3.0 Tesla," Journal of Computer Assisted Tomography 24(6), pp. 949-957 (2000).

Patent document 1. Japanese Unexamined Patent Publication No. 2006-255046.

In the above conventional art, a disease site can be recognized from a region having different susceptibility on the image.

However, it is difficult to understand the correspondence between the disease site and tissue structure.

SUMMARY OF THE INVENTION

It is desirable that the problem described previously is solved.

In a first aspect of the invention, a method for displaying a phase change fused image is provided. The method comprises the steps of: producing a phase change weighted image from a phase of each pixel of phase change image data and a color bar; producing an absolute value image from an absolute value of each pixel of absolute value image data and a grayscale; and displaying a phase change fused image in which the phase change weighted image and the absolute value image are overlaid on each other.

In the method of the first aspect, a region having different susceptibility can be recognized on a colored phase change weighted image. The colored phase change weighted image is overlaid on a monochromatic absolute value image clearly showing a tissue structure, and displayed. Accordingly, the correspondence between the region having different susceptibility and the tissue structure is easily visible.

In a second aspect of the invention, the method of the first aspect is provided in which the color bar is such that at least three colors, blue, black, and red, correspond to a phase range from a minimum phase to a maximum phase.

In the method of the second aspect, by use of the at least three colors, blue, black, and red, it can be clearly determined whether a phase of a region is at the center phase, toward the minimum phase, or toward the maximum phase.

In a third aspect of the invention, the method of the second aspect is provided in which the minimum phase is minus 180 degrees, and the maximum phase is plus 180 degrees.

In the method of the third aspect, the phase can be specified in the range of 360 degrees from minus 180 degrees to plus 180 degrees.

In a forth aspect of the invention, the method of any one of the first to third aspects is provided in which the step of producing the phase change weighted image comprises the step of masking.

In the method of the forth aspect, a target region is specified by the masking, so that a phase change fused image of the target region can be preferably displayed. For example, when a brain portion is specified by brain masking, a phase change fused image of the brain portion can be preferably displayed.

In a fifth aspect of the invention, the method of any one of the first to forth aspects is provided in which the step of producing the phase change weighted image comprises the step of low-pass filtering.

In the method of the fifth aspect, a phase change due to an inhomogeneous static magnetic field can be removed.

In a sixth aspect of the invention, the method of the fifth aspect is provided in which an operator can change the low-pass filtering.

In the method of the sixth aspect, the operator can change properties of the low-pass filtering.

In a seventh aspect of the invention, the method of any one of the first to sixth aspects is provided in which the operator can change the color bar.

In the method of the seventh aspect, the operator can change the color bar freely.

In an eighth aspect of the invention, the method of any one of the first to seventh aspects is provided in which the operator can change a window level setting.

In the method of the eighth aspect, the operator can change a contrast.

In a ninth aspect of the invention, a phase change fused image display apparatus comprises: a phase change weighted image producing device for producing a phase change weighted image from a phase of each pixel of phase change image data and a color bar; an absolute value image producing device for producing an absolute value image from an absolute value of each pixel of absolute value image data and a grayscale; and a phase change fused image displaying device for displaying a phase change fused image in which the phase change weighted image and the absolute value image are overlaid on each other.

In the apparatus of the ninth aspect, the method of the first aspect can be preferably executed.

In a tenth aspect of the invention, the phase change fused image display apparatus of the ninth aspect is provided in which the color bar is such that at least three colors, blue, black, and red, correspond to a phase range from a minimum phase to a maximum phase.

In the phase change fused image display apparatus of the tenth aspect, the method of the second aspect can be preferably executed.

In an eleventh aspect of the invention, the phase change fused image display apparatus of the tenth aspect is provided in which the minimum phase is minus 180 degrees, and the maximum phase is plus 180 degrees.

In the phase change fused image display apparatus of the eleventh aspect, the method of the third aspect can be preferably executed.

In a twelfth aspect of the invention, the phase change fused image display apparatus of any one of the ninth to eleventh aspects is provided in which the phase change image producing device comprises masking device.

In the phase change fused image display apparatus of the twelfth aspect, the method of the forth aspect can be preferably executed.

In a thirteenth aspect of the invention, the phase change fused image display apparatus of any one of the ninth to twelfth aspects is provided in which the phase change image producing device comprises a device for applying the row-pass filtering to complex image data.

In the phase change fused image display apparatus of the thirteen aspect, the method of the fifth aspect can be preferably executed.

In a fourteenth aspect of the invention, the phase change fused image display apparatus of the thirteenth aspect is provided in which an operator has operating device for changing the low-pass filtering.

In the phase change fused image display apparatus of the fourteenth aspect, the method of the sixth aspect can be preferably executed.

In a fifteenth aspect of the invention, the phase change fused image display apparatus of any one of the ninth to fourteenth aspects is provided in which the operator has an operating device for changing the color bar.

In the phase change fused image display apparatus of the fifteenth aspect, the method of seventh aspect can be preferably executed.

In a sixteenth aspect of the invention, the phase change fused image display apparatus of any one of the ninth to fifteenth aspects is provided in which the operator has an operating device for changing a window level setting.

In the phase change fused image display apparatus of the sixteenth aspect, the method of eighth aspect can be preferably executed.

In a method and apparatus for displaying a phase change fused image according to the invention, a region having different susceptibility can be recognized on a colored phase change weighted image. Since the colored phase change weighted image is overlaid on a monochrome absolute value image, and displayed, the correspondence between the region having different susceptibility and a tissue structure can be easily visible.

A method and apparatus for displaying a phase change fused image according to the invention can be used in the MRI apparatus.

Further objects and advantages of the present invention will be apparent from the following description of the preferred embodiments of the invention as illustrated in the accompanying drawings.

DETAILED DESCRIPTION OF THE INVENTION

In reference to the appended drawings, embodiments of the invention are explained below in detail. The invention is not limited to the embodiments.

Embodiment 1

Figure 1:
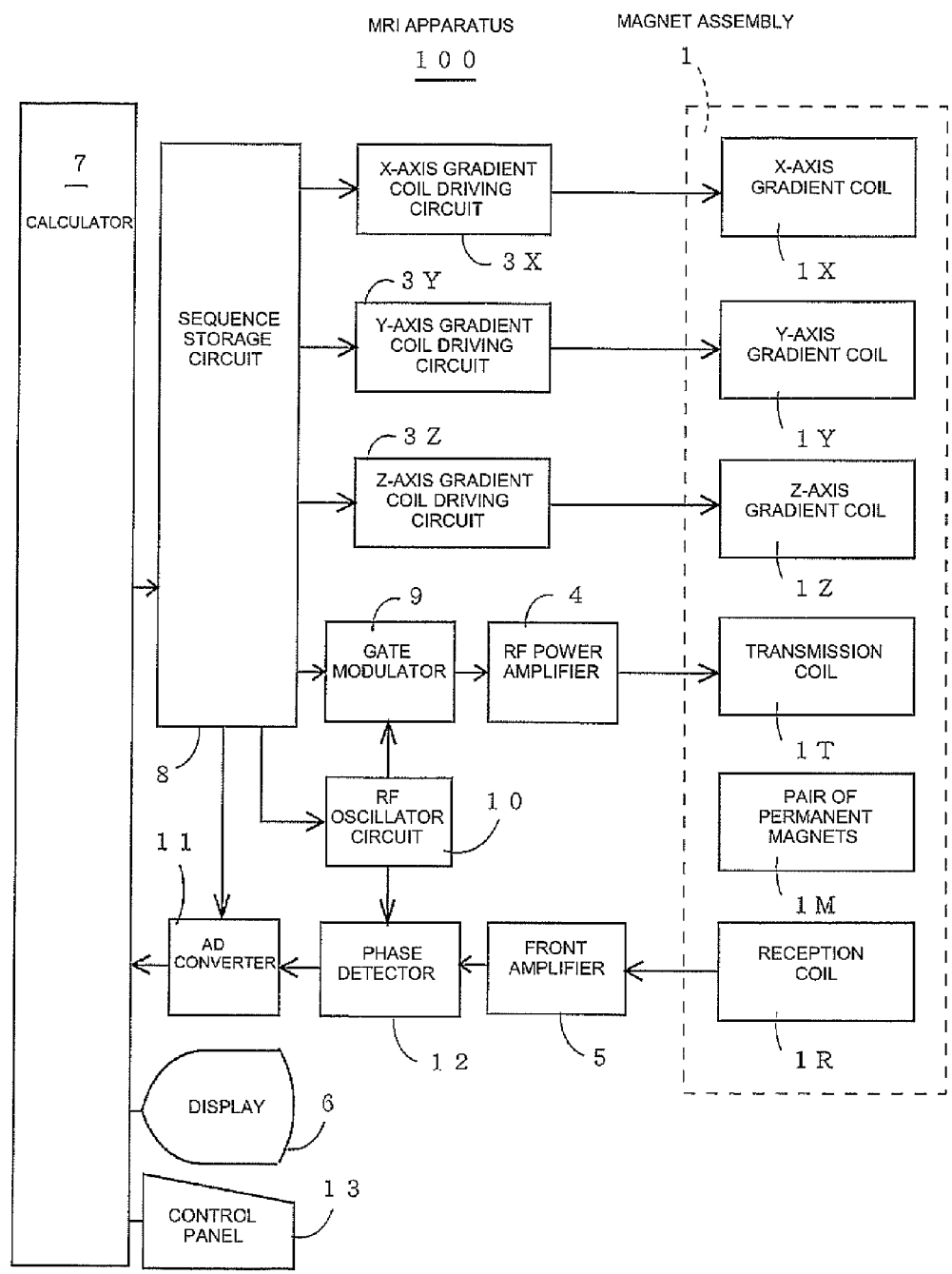
FIG. 1 is a block diagram showing a functional structure of an MRI apparatus of Embodiment 1.

FIG. 1 is a block diagram showing a functional structure of an MRI apparatus 100 of Embodiment 1.

In this MRI apparatus 100, a magnet assembly 1 has a bore. Through this bore, a subject is inserted into the MRI apparatus 100. Around this bore, the MRI apparatus 100 includes an X-axis gradient coil 1X for forming an X-axis gradient magnetic field; a Y-axis gradient coil 1Y for forming a Y-axis gradient magnetic field; a Z-axis gradient coil 1Z for forming a Z-axis gradient magnetic field; a transmission coil 1T providing an RF pulse for exciting spins of atomic nuclei in the subject; a reception coil 1R for detecting an NMR signal from the subject; and a pair of permanent magnets 1M for forming a static magnetic field.

Instead of the pair of permanent magnets 1M, a superconducting magnet may be used.

The X-axis gradient coil 1X is connected to an X-axis gradient coil driving circuit 3X. The Y-axis gradient coil 1Y is connected to a Y-axis gradient coil driving circuit 3Y. The Z-axis gradient coil 1Z is connected to a Z-axis gradient coil driving circuit 3Z. The transmission coil 1T is connected to an RF power amplifier 4.

The X-axis gradient coil driving circuit 3X includes an x-axis gradient amplifier. The Y-axis gradient coil driving circuit 3Y includes a Y-axis gradient amplifier. The Z-axis gradient coil driving circuit 3Z includes an Z-axis gradient amplifier. The RF power amplifier 4 includes an RF amplifier.

In accordance with an instruction from a calculator 7, a sequence storage circuit 8 operates the gradient coil driving circuits 3X, 3Y, and 3Z on the basis of a pulse sequence stored in the sequence storage circuit 8 to generate a gradient magnetic field from the gradient coils 1X, 1Y, and 1Z. Then, the sequence storage circuit 8 operates a gate modulator 9 to modulate a carrier output signal of an oscillator circuit 10 to a pulsed signal having a predetermined timing, a predetermined envelope shape, and a predetermined phase. This pulsed signal is added to the RF power amplifier 4 as an RF pulse, amplified in the RF power amplifier 4, and then applied to the transmission coil 1T.

The reception coil 1R is connected to a front amplifier 5.

The front amplifier 5 amplifies an NMR signal received by the reception coil 1R from a subject, and inputs the signal to a phase detector 12. The phase detector 12 detects a phase of the NMR signal from the front amplifier 5 in accordance with a reference signal outputted from the RF oscillator circuit 10, and applies the signal to an AD converter 11. The AD converter 11 converts an analog signal after the phase detection to a digital data, and inputs the data to the calculator 7.

The calculator 7 executes the entire control such as reception of information inputted from a control panel 13. Then, the calculator 7 reads and calculates the digital data from the AD converter 11 to produce an image, and displays the image and a message on a display 6.

The calculator 7 includes a CPU and memory.

Figure 2:
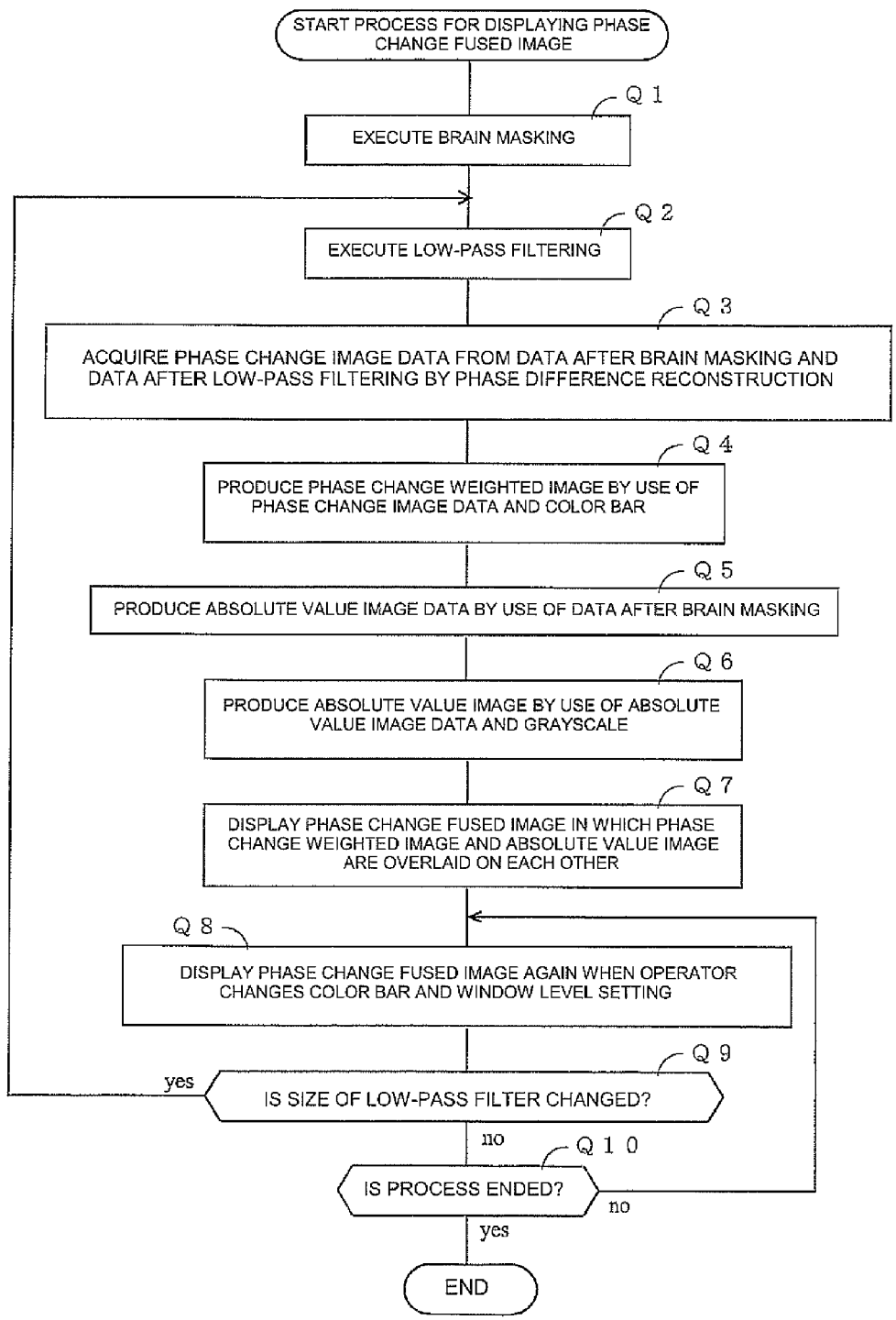
FIG. 2 is a flowchart showing a phase change fused image displaying process of Embodiment 1.

FIG. 2 is a flowchart of a process for displaying a phase change fused image.

In Step Q1, brain masking is executed.

Figure 3:
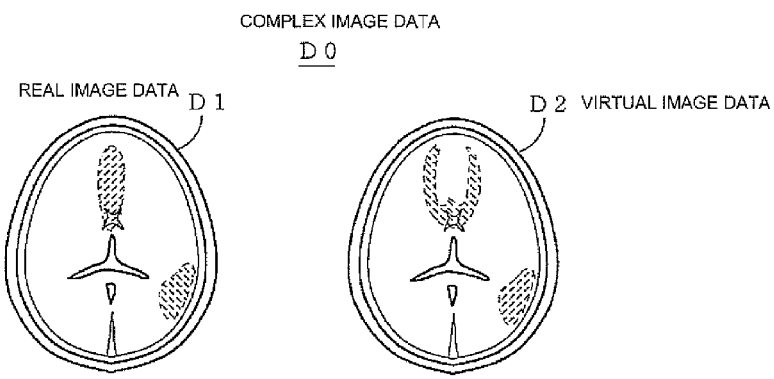
FIG. 3 is a schematic view showing complex image data.

More especially, complex image data (data of xy space) D0 shown in FIG. 3 is acquired from an MR data of the subject (data of k space) by reconstruction. The brain masking is applied to the complex image data D0 to acquire complex image data D4 shown in FIG. 4. Then, the MR data after the brain masking is acquired by inverse reconstruction from the complex image data D4 after the brain masking.

In FIG. 3, the complex image data D0 is exampled as real image data D1 and virtual image data D2.

Figure 4:
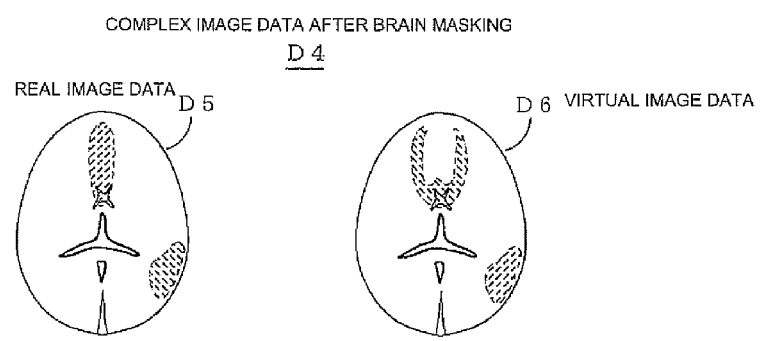
FIG. 4 is a schematic view showing the complex image data after brain masking.

In FIG. 4, the complex image data D4 after the brain masking is exampled as real image data D5 and virtual image data D6. An image of only a brain portion is specified by the brain masking.

In Step Q2, low-pass filtering is executed. More especially, an N×N matrix around the center of the k space of the MR data after the brain masking is specified as an MR data after the low-pass filtering. The N is a size of the low-pass filter. The N is, for example, 16, 32, 64, or 128.

In Step Q3, phase change image data is generated by Phase Difference Reconstruction from the MR data after the low-pass filtering.

Figure 5:
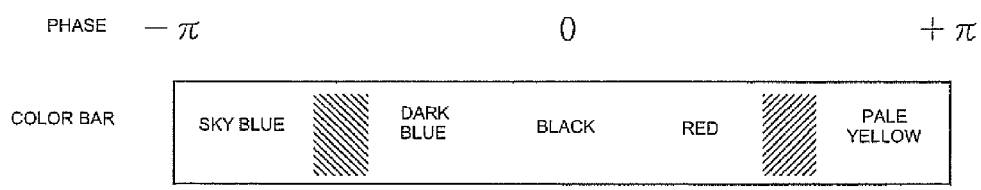
FIG. 5 is a schematic view showing a color bar.
Figure 6:
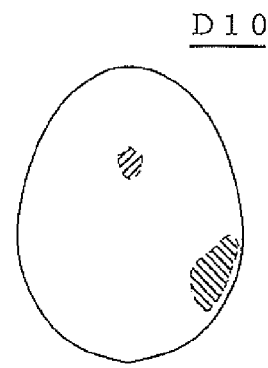
FIG. 6 is a schematic view showing a phase change weighted image.

In Step Q4, by use of the phase change image data and a color bar shown in FIG. 5, a phase change weighted image D10 shown in FIG. 6 is produced.

In Step Q5, absolute value image data is produced from the complex image data D4 after the brain masking.

Figure 7:
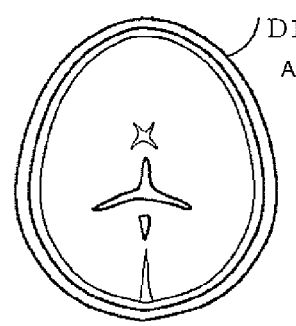
FIG. 7 is a schematic view showing an absolute value image.

In Step Q6, an absolute value image D11 shown in FIG. 7 is produced from the absolute value image data and a grayscale. This absolute value image D11 is a T2* weighted image.

Figure 8:
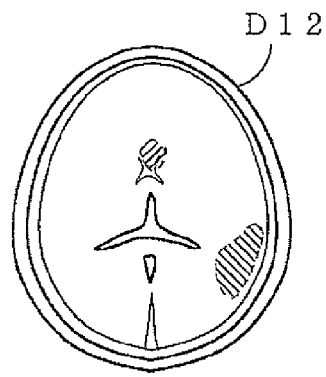
FIG. 8 is a schematic view showing a phase change fused image.

In Step Q7, the phase change weighted image D10 and absolute value image D11 are overlaid on each other to display a phase change fused image D12 shown in FIG. 8.

In Step Q8, when an operator changes the color bar and/or the window level setting, the phase change fused image is displayed again.

Figure 9:
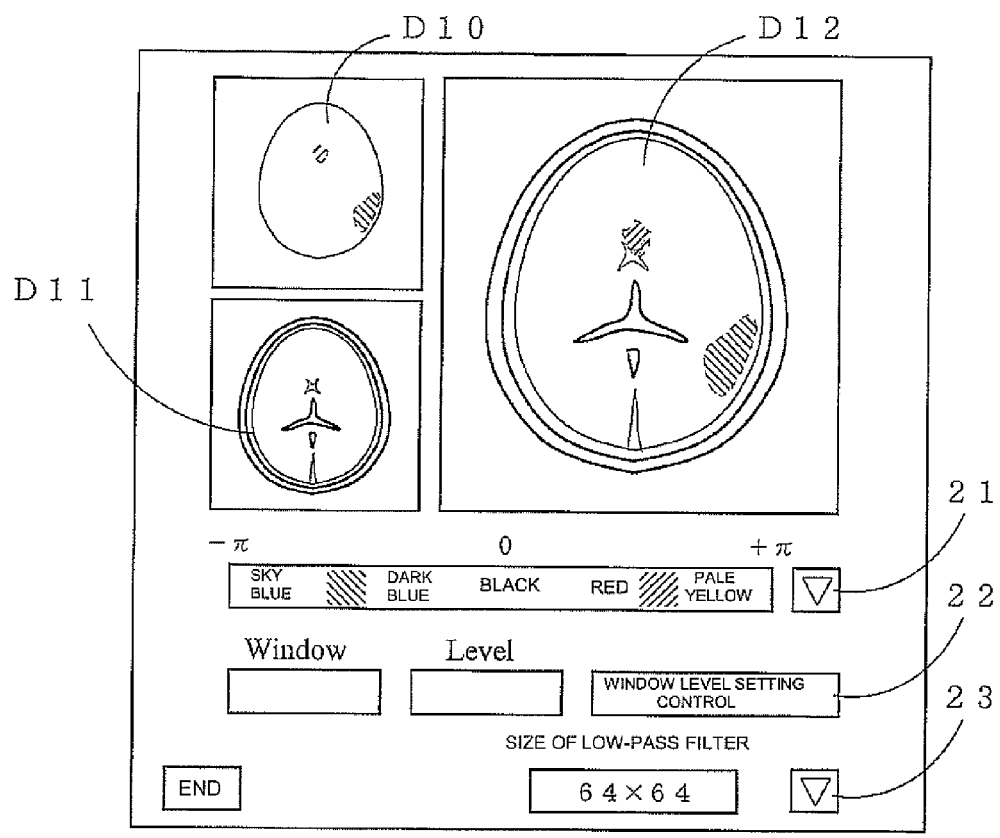
FIG. 9 is a schematic view showing a screen operable by an operator.

As shown in FIG. 9, the color bar can be changed by operating a color bar selection button 21 on a screen. The window level setting can be changed by operating a window level setting control button 22 on the screen.

In Step Q9, it is determined whether the operator changes a size of the low-pass filter. When the operator has changed a size of the low-pass filter, the flow returns to Step Q2. When the operator has not changed a size of the low-pass filter, the flow goes to Step Q10.

As shown in FIG. 9, the low-pass filter can be changed by operating the low-pass filter selection button 23 on the screen.

In Step Q10, it is determined whether an instruction to complete the process is done. When no instruction is done, the flow goes to Step Q8. When the instruction is done, the flow completes.

In the MRI apparatus 100 of Embodiment 1, a region having different susceptibility can be recognized on the colored phase change weighted image D10. Since the colored phase change weighted image D10 is overlaid on the monochromatic absolute value image D11 showing a clear tissue structure, the correspondence between the region having different susceptibility and the tissue structure can be easily visible.

Embodiment 2

The phase change fused image display function installed in the MRI apparatus 100 of Embodiment 1 may be separate from the MRI apparatus 100 as another phase change fused image display apparatus.

Many widely different embodiments of the invention may be configured without departing from the spirit and the scope of the present invention. It should be understood that the present invention is not limited to the specific embodiments described in the specification, except as defined in the appended claims.

The invention claimed is:

1. A method for displaying a phase change fused image, the method comprising the steps of:
    producing a phase change weighted image from a phase of each pixel of phase change image data and a color bar comprising the steps of:
        applying a brain masking to received magnetic resonance (MR) data;
        applying a low-pass filter to the MR data having a masking applied; and
        producing a phase change weighted image by phase difference reconstruction of the MR data after a low-pass filter is applied;
    producing an absolute value image from an absolute value of each pixel of absolute value image data and a grayscale; and
    displaying the phase change fused image in which the phase change weighted image and the absolute value image are overlaid on each other.

2. The method according to claim 1, wherein the color bar is such that at least three colors, blue, black, and red, correspond to a phase range from a minimum phase to a maximum phase.

3. The method according to claim 2, wherein the minimum phase is minus 180 degrees, and the maximum phase is plus 180 degrees.

4. The method according to claim 1, wherein an operator can change the low-pass filtering.

5. The method according to claim 1, wherein the operator can change the color bar.

6. The method according to claim 1, wherein the operator can change a window level setting.

7. A phase change fused image display apparatus comprising:
    a phase change weighted image producing device for producing a phase change weighted image from a phase of each pixel of phase change image data and a color bar, the phase change weighted image producing device configured to:
        apply a brain masking to received magnetic resonance (MR) data;
        apply a low-pass filter to the MR data having a masking applied; and
        produce a phase change weighted image by phase difference reconstruction of the MR data after a low-pass filter is applied;
    an absolute value image producing device for producing an absolute value image from an absolute value of each pixel of absolute value image data and a grayscale; and
    a phase change fused image displaying device for displaying a phase change fused image in which the phase change weighted image and the absolute value image are overlaid on each other.

8. The phase change fused image display apparatus according to claim 7, wherein the color bar is such that at least three colors, blue, black, and red, correspond to a phase range from a minimum phase to a maximum phase.

9. The phase change fused image display apparatus according to claim 8, wherein the minimum phase is minus 180 degrees, and the maximum phase is plus 180 degrees.

10. The phase change fused image display apparatus according to claim 9, wherein the phase change image producing device comprises device for masking.

11. The phase change fused image display apparatus according to claim 9, wherein the phase change image producing device comprises device for low-pass filtering.

12. The phase change fused image display apparatus according to claim 8, wherein the phase change image producing device comprises device for masking.

13. The phase change fused image display apparatus according to claim 7, wherein the phase change image producing device comprises device for masking.

14. The phase change fused image display apparatus according to claim 7, wherein an operator includes an operating device for changing the low-pass filtering.

15. The phase change fused image display apparatus according to claim 7, wherein the operator includes an operating device for changing the color bar.

16. The phase change fused image display apparatus according to claim 7, wherein the operator includes an operating device for changing a window level setting.

* * * * *